219-121
12/28/76   XR   4,000,423   SR

United States Patent [19]
Janes et al.

[11] 4,000,423
[45] Dec. 28, 1976

[54] FAST RESPONSE HIGH TEMPERATURE EVAPORATION CONTROL

[75] Inventors: George Sargent Janes, Lincoln; Leonard N. Litzenberger, Andover; Donald F. Twombly, Woburn, all of Mass.

[73] Assignee: Jersey Nuclear-Avco Isotopes, Inc., Bellevue, Wash.

[22] Filed: Dec. 5, 1974

[21] Appl. No.: 529,629

[52] U.S. Cl. .................... 250/423 P; 13/31; 219/121 EB; 250/492 B
[51] Int. Cl.² .................. B23K 9/00; C08J 1/02; H01J 27/00
[58] Field of Search ............ 219/121 EB, 121 EM; 250/423 P, 396, 398, 492 B; 13/31

[56] References Cited
UNITED STATES PATENTS 3,432,335   3/1969   Schiller et al. ................ 13/31

Primary Examiner—Alfred E. Smith
Assistant Examiner—T. N. Grigsby
Attorney, Agent, or Firm—Weingarten, Maxham & Schurgin

[57] ABSTRACT

An electron beam vapor source for use in laser enrichment of uranium and providing fast response intermittent vaporization to permit interruption of the enrichment process without wasting vapor or requiring long term reheating.

16 Claims, 3 Drawing Figures

FAST RESPONSE HIGH TEMPERATURE EVAPORATION CONTROL

FIELD OF THE INVENTION

The present invention relates to electron beam vaporization apparatus and in particular to method and apparatus for providing intermittent evaporation.

BACKGROUND OF THE INVENTION

In uranium enrichment as, for example, taught by U.S. Pat. No. 3,772,519 and U.S. Pat. application Ser. No. 328,954, filed Feb. 2, 1973 and patent application Ser. No. 469,407, filed May 13, 1974, incorporated herein by reference, a vapor of uranium is generated and illuminated with laser radiation tuned to produce isotopically selective photo-excitation of, for example, the U-235 isotope. The excited particles are ionized and separately collected on plates using magnetohydrodynamic acceleration forces on the charged particles.

In such a system, the laser radiation is preferably applied in pulses at a repetition rate which insures that all portions of the following vapor are illuminated with the radiation in order to provide efficient operation. To provide laser radiation of this sort a system of multiple lasers has been suggested as represented in U.S. Pat. application Ser. No. 438,029, filed Jan. 30, 1974, incorporated herein by reference, with plural beams of output radiation combined into a single beam of augmented pulse rate by rotating optics. It may occur that for continuous processing according to such a technique, one or more of the lasers may occasionally be nonoperative for an interval of time for such purposes as maintenance, or it may be desired to operate the enrichment system efficiently with less than the total complement of lasers. Additionally, it may be desirable to make short term adjustments to the enrichment apparatus within the vapor environment. For such occasions, it is desired to be able to rapidly extinguish the generation of vapor for a period without loss of heat from the uranium mass to permit rapid restart of the vapor generation. In the case of missing lasers in the laser system such periodic cessation in the vapor generation would occur periodically at a relatively fast repetition rate for very short intervals while in the case of other partial shut down of the processing the interruption would be somewhat longer. Thus it is desirable to provide a uranium vaporization source capable of rapid shut down and restart in both situations with relatively little vapor waste.

BRIEF SUMMARY OF THE INVENTION

In accordance with the preferred embodiment of the present invention, an electron beam vapor source is provided to generate a radially expanding uranium vapor flow from a point or line on the surface of a molten uranium supply with the capability of rapidly stopping and restarting the generation of vapor to conserve the supply without a time consuming cooling and reheating cycle.

Apparatus for providing this feature of the invention is operative to focus a high energy electron beam onto the surface of a mass of uranium in a central line or the spot pattern to promote melting of the uranium in a region surrounding the point of impact of the electron beam and vaporization of the molten uranium in the immediate vicinity of the point of impact. Cessation of vaporization is rapidly effected by causing the electron beam to scan the surface of the uranium supply at a relatively high frequency to prevent heating of any one spot to the point of vaporization while at the same time maintaining the thermal energy within the uranium supply at a sufficiently high level to leave only a short delay in the resumption of vapor generation by restoring the point of impact of the electron beam to the central line or spot.

The electron beam evaporation source is typically used in apparatus for laser enrichment of uranium wherein a beam of high pulse repetition rate laser radiation is applied to the expanding uranium vapor to produce isotopically selective photoexcitation. The vapor source according to the present invention provides a sufficiently fast variation in vapor output to permit cutoff of vapor generation during intervals when pulses in the pulse train are missing in order to limit waste of the vapor source and contamination of the waste and product collections from the enrichment process. Additionally, the apparatus permits a longer term interruption of vapor generation as, for example, to permit simple adjustments without requiring the loss of time for cooling and reheating of the uranium supply. Additionally, the apparatus of the present invention may be employed during start-up of the enrichment process to create the uranium melt from solid chunks of uranium laid within the source without splatter or longer term shut down when the uranium supply has been permitted to cool in order to bring the uranium supply up to temperature for resumption of high rate vaporization.

BRIEF DESCRIPTION OF THE DRAWING

These and other features of the present invention are more fully set forth below in the detailed description of the preferred embodiment, presented for purposes of illustration and not by way of limitation, and in the accompanying drawing of which.

DETAILED DESCRIPTION OF THE PREFERRED EMBODIMENT

The present invention contemplates an electron beam evaporator for a high vaporization temperature material such as elemental uranium for use in a process, typified by uranium laser enrichment, to provide intermittent vaporization of the uranium material.

Figure 1:
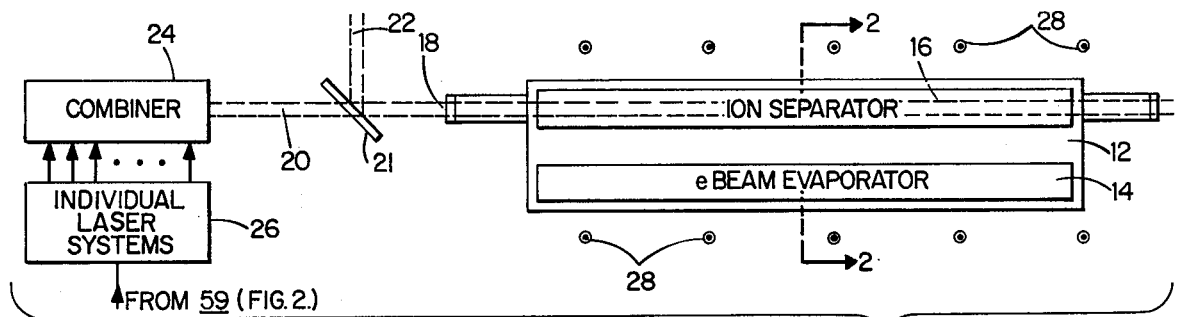
FIG. 1 is a schematic view of a portion of enrichment apparatus for use with the present invention.

By reference to FIG. 1, a general schematic diagram is illustrated by uranium enrichment using the evaporation apparatus of the present invention. As shown there, a chamber 12 is provided for separating the uranium isotopes in a flowing uranium vapor produced by an electron beam evaporator 14. The separation is produced within an ion separator 16 to which laser radiation in a beam 18 is applied to produce isotopically selective photoexcitation of one isotope in the vapor. The laser beam 18 is produced as a composite beam from plural laser beams 20 and 22 or more for the preferred mode combined by a dichroic mirror 21. Typically, each beam such as beam 20 consists of a series of high repetition rate pulses, typically up to 50,000 pulses per second of finely turned photon energy to produce isotopic selectivity in the absorption by the uranium vapor particles. The pulse repetition rate in the beam 20 is typically such to permit illumination of all particles in the vapor from the vapor source 14 over the transverse dimension of the beam 18 in the direction of vapor flow as more clearly illustrated below. In providing such a pulse repetition rate, it has been suggested, as fully illustrated in U.S. Pat. application Ser. No. 438,029, to combine the laser pulses from a plurality of separate radiation sources with rotating optical elements such as a rotating rhomboid having parallel reflecting surfaces rotated to receive each of the beams on one surface as the pulse in each beam occurs, and to reflect it toward the other surface for reflection onto a single beam path of augmented pulse rate.

The excited vapor particles within the ion separator 16 are subsequently ionized by laser, or electron impact techniques, to produce a concentration of ionized particles of one isotope type which may then be conveniently accelerated onto separate collection surfaces by interaction of a magnetic field from coils 28 and an electric field from voltage pulses applied to plates within the ion separator 16 subsequent to each pulse of laser radiation.

Figure 2:
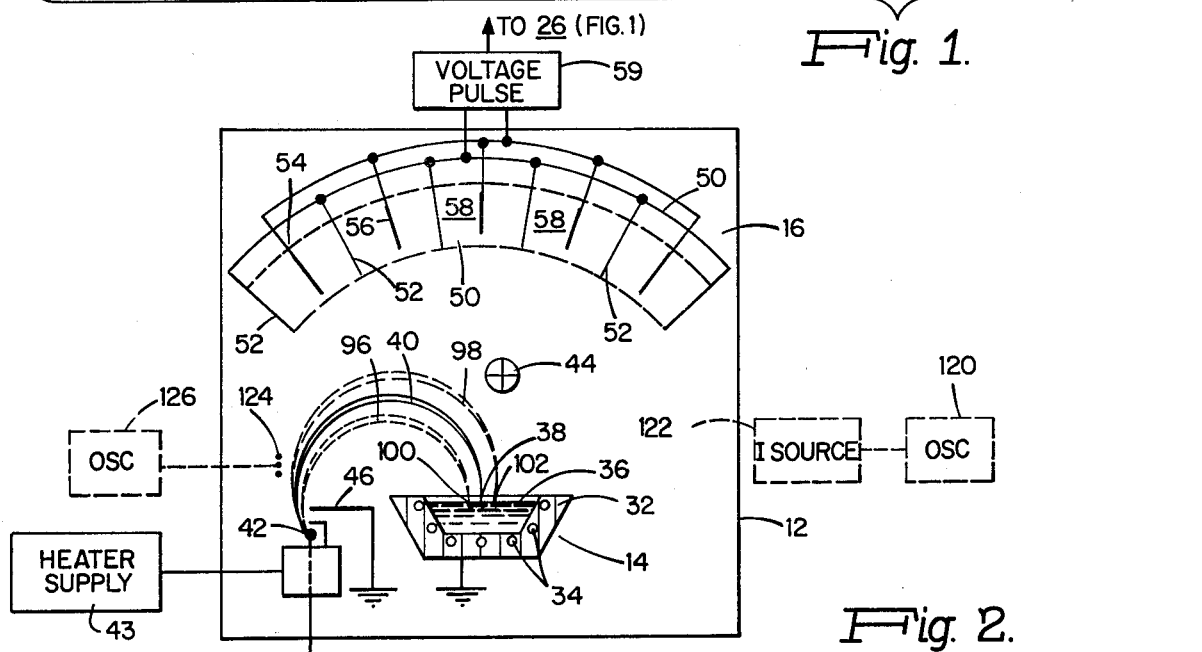
FIG. 2 is a sectional interior diagram of a portion of the FIG. 1 apparatus including circuitry illustrating the present invention.

Details of the electron beam evaporation source 14 within the chamber 12 are illustrated in FIG. 2 which comprises an interior sectional view along the section lines indicated in FIG. 1. As shown there in example, the vapor source 14 includes a copper crucible 32 having a plurality of cooling ports 34 for water and containing a mass 36 of uranium which is liquefied and vaporized in a region surrounding a point of impact 38 for an electron beam 40 along the surface of the mass 36. Typically, the point of impact 38 is a line extending most of the entire length of the surface of the uranium mass 36. Electron beam 40 originates from a long filament 42 heated by a supply 43 and is focused by magnetic field 44 generated by the coils 28 illustrated in FIG. 1. The electron beam 40 is additionally guided by an anode 46 which is connected to ground along with the crucible 32.

The ion separator 16 into which the uranium vapor flows in a radial expansion comprises a rear arcuate conductive plate 50 formed as a cylindrical section and having electrically connected plates 52 radially extending toward the line source 38 at a distance to define chambers 54. The chambers 54 contain an interior electrode 56 which extends the length of the chamber. The laser radiation in beam 18 is applied within the chambers 54 in regions 58 bounded by the dashed lines by, typically, multiple reflections of the beam 18 through adjacent halves of the chambers 54. The ionized particles created in the vapor in the chambers 54 by photoexcitation and ionization are accelerated onto one side of the plates 52 by magnetohydrodynamic forces created by the cooperation of the magnetic field 44, typically 150 gauss, with an electric field applied by a source 59 between the plates 52 and 56 in microsecond duration pulses of typically 60 volt potential.

The filament 42 is energized with respect to the grounded crucible 32 and uranium mass 36 from the plate of a regulator tube 60 which is high power, high voltage tube of the type that is used in radio broadcast stations. Typically, the plate of the tube 60 maintains a 20 KV potential between the filament 42 and ground. The tube 60 has a screen grid which is biased from a source 62 in a conventional manner and a control grid which is operated through an amplifier 64 along with the cathode for the tube 60. A 36 KV negative potential from a power supply 66 is applied to the cathode of tube 60 causing the amplifier 64 to be operated at high negative potential.

The signal on the plate of the tube 60 is applied through a voltage divider network 68, buffer amplifier 70 and resistor 72 to a current summing terminal 74 connected into a summing amplifier 76. Current developed across a resistor 78 from a terminal 80 of reference potential is also applied to the summing junction 74 along with current developed across a resistor 82 from the output of a grated amplifier 84 which in turn receives the output of an oscillator 86 of typically 1 KHz frequency. The gating of the amplifier 84 is controlled by a delay circuit 88 which inhibits the oscillation from oscillator 86 until the expiration of the delay defined by the circuit 88. The delay of circuit 88 is reinstated by pulse trigger signals from a trigger generator 90 which is used also to sequentially activate each of the individual laser system 26 and control the synchronous rotation of the combining optics in the combiner 24. In this manner, the amplified oscillations are inhibited except during those intervals when one of the individual lasers in the laser systems 26 are absent and no trigger signal is provided by the generator 90 to activate that laser.

The controlled DC signal, or controlled DC signal with additive oscillation from the amplifier 76 is applied to a light source 92 which directs a beam of light 94 of corresponding position or intensity to a photoelectric transducer within the amplifier 64 to control the output of amplifier 64 in accordance with the signal provided from the amplifier 76. The photo beam 94 provides high voltage isolation between the control electronics responsive to the potential from the plate of tube 60 and the high negative voltage at the amplifier 64 and tube 60.

Under the conditions when the gated amplifier 84 is inhibited from passing the oscillation through to the amplifier 64, the tube 60 provides a controlled DC potential to the filament 42 at which voltage the electron beam 40 is focusd to a constant central position 38. When the oscillation is added to the signal applied to the amplifier 64, the tube 60 provides a variation in the accelerating potential between the filament 42 and uranium 36, forcing the electron beam 40 to oscillate between positions 96 and 98, whereby the point of impact scans an area between extreme points of impact 100 and 102 on the surface of the uranium mass 36. This oscillation almost instantaneously stops vaporization from the surface of the uranium mass 36 by spreading the energy in the beam 40 across a substantially greater area and preventing a sufficient energy density at any point between the limits 100 and 102 to provide vaporization. Nevertheless, the same heat energy is applied to the uranium mass 36 keeping its temperature sufficiently high so that within typically 5 milliseconds of the cessation of scanning and the return of the electron beam 40 to the central position of impact 38, full rate uranium vaporization is restored. This permits rapid vaporization start and stop sequencing for conditions where pulses in the laser beams 18 are deleted, typically several beams at peak repetition rate, or in circumstances where processing is to be interrupted or adjustments made to the ion separator 16 or other enrichment equipment. For relatively long term shut down, the energy in the beam 40 during the scan may be reduced slightly without greatly increasing the time required to reheat the mass 36 to vaporization conditions while at the same time saving substantial energy.

Figure 3:
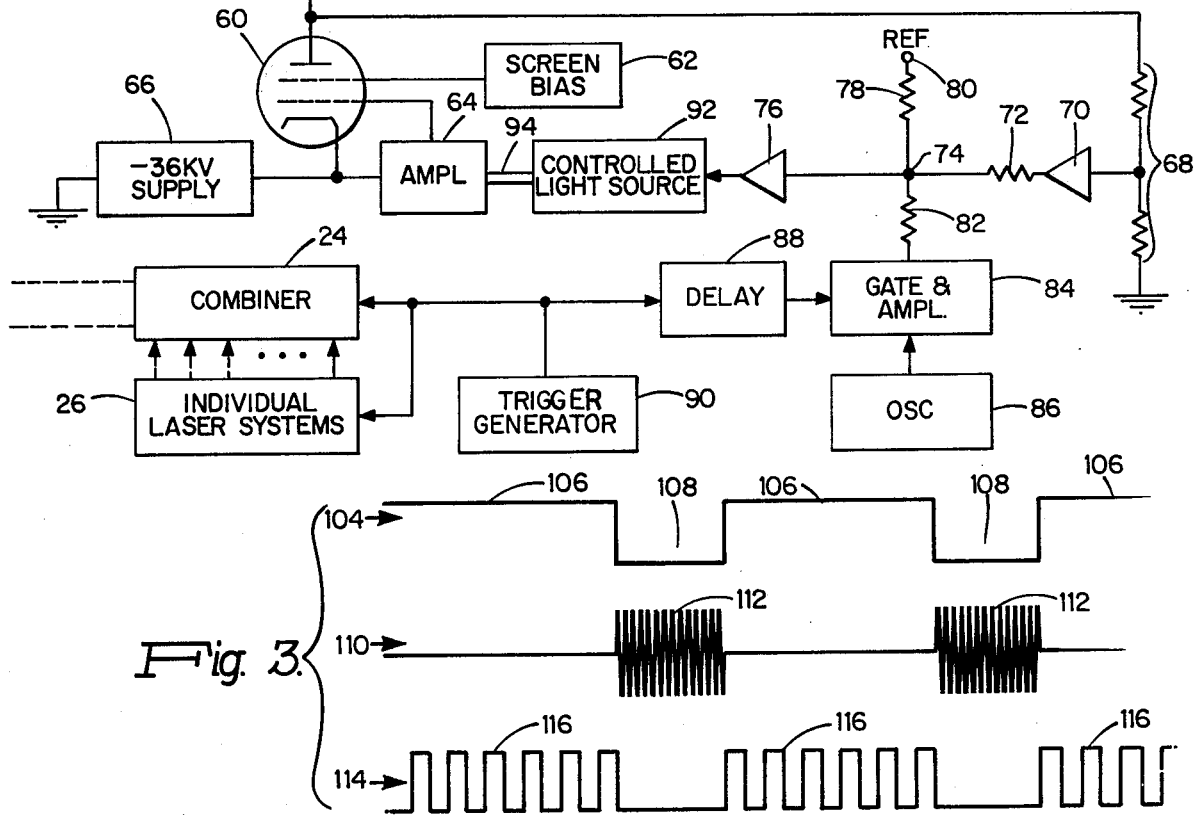
FIG. 3 is a waveform diagram useful in explaining the operation of the present invention.

The sequence of intermittent evaporation may be further described with reference to FIG. 3 wherein a waveform 104 illustrates intervals of vaporization 106 interspersed with intervals of no vaporization 108. A waveform 110 illustrates the output typically of the amplifier 76 which is of constant potential during the intervals 106 but includes a high frequency, typically 1 $KH_2$, oscillation 112 during the intervals 108. As shown by a further waveform 114, the intervals 106 may include periods of continuous laser pulses within the beam 18 such as represented by the pulses 116 whereas the intervals 108 would include periods of no laser pulse generation during such times as maintenance or repair to several of the individual lasers in the laser systems 26 as part of normal processing maintenance, or in cases where a full complement of lasers was not available.

As an alternative to oscillating the electron beam accelerating potential between the filament and the crucible 32, the magnetic field 44 can be oscillated as by an oscillator 120 associated with a current source 122 for coils 28 as shown in FIG. 2. Also alternatively, an oscillating potential may be applied to an electrode 124 from an oscillator 126 instead of oscillating the accelerating potential.

The above description and drawing are intended as exemplary implementation of the present invention, the scope of which is to be defined only in accordance with the following claims.

What is claimed is:

1. Evaporation apparatus providing rapid adjustments in the evaporation rate of a material comprising:
   a supply of the material to be evaporated and having an exposed surface thereof;
   means for applying an energy beam to the surface of the material to be evaporated in an intensity to produce evaporation of the material from the point of impact of the beam on the surface thereof;
   means for controlling the point of application of the beam on the surface of the material; and
   means operative with said control means to cause the point of impact of the beam on the surface of the material to remain generally fixed for a period to provide evaporation of the material in alternation with causing the point of impact to vary over the surface of the material for a period to provide heating of said material without evaporation.

2. The evaporation apparatus of claim 1 wherein said means for applying a beam of energy includes means for applying a focused electron beam to the surface of the material.

3. The evaporation apparatus of claim 2 wherein:
   said electron beam applying means including a filament; and
   said means for controlling the point of application of the electron beam includes:
     means for applying an accelerating voltage between the filament and the material to be evaporated;
     means for maintaining the accelerating voltage constant during the period when evaporation from the point of application of the electron beam is desired; and
     means for oscillating the accelerating voltage during the period when evaporation from the surface of the material is undesired.

4. The evaporation apparatus of claim 2 further including:
   means for applying a magnetic field to focus said beam of electrons; and
   said controlling means including means for varying the strength of the magnetic field.

5. The evaporation apparatus of claim 2 further including:
   an electrode adjacent the path of the electron beam; and
   said controlling means includes means for applying a varying electric potential to said electrode.

6. The evaporation apparatus of claim 1 further including:
   means for providing isotopically selective photoexcitation of the evaporated material and including:
     a plurality of sources of pulsed laser radiation tuned for isotopically selective excitation of the vaporized material and providing the pulses in a time sequence having one or more pulses deleted;
     means for providing the period during which the point of application of the beam is varied on the surface of the material during intervals when one or more pulses are deleted.

7. The evaporation apparatus of claim 6 wherein the material to be evaporated includes elemental uranium.

8. The evaporation apparatus of claim 7 further including means for ionizing the photoexcited particles in the vapor of the material.

9. The evaporation apparatus of claim 8 further including means for separating the ionized particles from the vapor of the material.

10. The evaporation apparatus of claim 9 wherein said separating means includes means for applying magnetohydrodynamic acceleration forces to the ionized particles in the vapor of the material.

11. Apparatus providing alternate periods of evaporation and nonevaporation of a material by an electron beam evaporator comprising:
   a crucible;
   a supply of uranium in said crucible for evaporation;
   a filamentary source of electrons for application to the exposed surface of uranium in said crucible;
   means for applying an accelerating voltage between the filamentary source and the exposed surface of the material;
   means for applying a magnetic field transverse to the direction of motion of the electrons accelerated toward the exposed surface of the material;
   means for maintaining the potential between the filamentary source and the exposed surface at a predetermined level to provide, in cooperation with the magnetic field from said magnetic field source, focused application of a beam of electrons on the exposed surface of the uranium to provide vaporization of the uranium in the region of impact of the electron beam; and
   means operative at one or more times for varying the point of focus of the electron beam from the filamentary source on the exposed surface to maintain heating of the uranium without vaporization thereof.

12. The apparatus of claim 11 wherein said means for varying the point of focus includes:
   an ascillator having a time varying output signal;

means for combining the time varying output signal with the occelerating voltage during the one or more times to provide a time varying accelerating potential between the filamentary source and exposed surface.

13. The apparatus of claim 12 wherein and combining means includes:
means for summing said time varying output signal with a control signal to provide a summation signal; and
means for applying the summation signal to said means for applying the accelerating voltage in D.C. isolation.

14. The apparatus of claim 11 further including:
means for generating plural beams of pulsed laser radiation;
means for combining the plural beams of laser radiation into a single beam having staggered pulses of laser radiation with periods of no laser pulses;
the one or more times during which the means for varying the point of focus is operative corresponding to the periods of no laser pulses.

15. The apparatus of claim 11 wherein said means for varying the point of focus includes:
an electrode placed near the path of the electron beam and relatively closer to the filamentary source than the point of focus of the beam on the exposed surface; and
means for applying a time varying signal to the electrode during the one or more times of operation of the means for varying the point of focus.

16. The apparatus of claim 11 wherein said means for varying the point of focus includes means for varying the intensity of the applied magnetic field.

* * * * *